(12) United States Patent
Kiuchi et al.

(10) Patent No.: US 7,352,548 B2
(45) Date of Patent: Apr. 1, 2008

(54) COMPOSITE INTEGRATED SEMICONDUCTOR DEVICE

(75) Inventors: Shin Kiuchi, Nagano (JP); Kazuhiko Yoshida, Nagano (JP); Takeshi Ichimura, Nagano (JP); Naoki Yaezawa, Nagano (JP); Shoichi Furuhata, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 11/723,356

(22) Filed: Mar. 19, 2007

(65) Prior Publication Data

US 2007/0285855 A1  Dec. 13, 2007

Related U.S. Application Data

(63) Continuation of application No. 10/235,841, filed on Sep. 6, 2002, now abandoned.

(30) Foreign Application Priority Data

Sep. 6, 2001 (JP) .............................. 2001-269773

(51) Int. Cl.
*H02H 9/00* (2006.01)
(52) U.S. Cl. ....................................................... 361/56
(58) Field of Classification Search ................... 361/56
See application file for complete search history.

(56) References Cited

U.S. PATENT DOCUMENTS

| | | | |
|---|---|---|---|
| 4,736,271 A | 4/1988 | Mack et al. .................... 361/56 |
| 4,887,182 A | 12/1989 | Sweet ......................... 361/117 |
| 4,945,395 A | 7/1990 | Suehiro ....................... 257/203 |
| 5,014,155 A | 5/1991 | Abe et al. ...................... 361/56 |
| 5,352,942 A | 10/1994 | Tanaka et al. |
| 5,625,280 A | 4/1997 | Voldman .................... 323/284 |
| 5,721,656 A | 2/1998 | Wu et al. ...................... 361/56 |
| 6,218,854 B1 | 4/2001 | Ko ................................ 326/30 |
| 6,631,061 B2* | 10/2003 | Okawa ........................ 361/56 |
| 6,657,318 B2* | 12/2003 | Ishikawa et al. .............. 307/30 |
| 6,753,836 B2 | 6/2004 | Kwon .......................... 345/87 |
| 6,844,241 B2* | 1/2005 | Halahan et al. ............. 438/454 |
| 2001/0028239 A1 | 10/2001 | Vandehenst ................. 323/235 |
| 2002/0012212 A1 | 1/2002 | Yasumori ..................... 361/56 |

FOREIGN PATENT DOCUMENTS

| | | |
|---|---|---|
| JP | 4-253366 | 9/1992 |
| JP | 8-64685 | 3/1996 |

(Continued)

OTHER PUBLICATIONS

U.S. Appl. No. 10/235,841, filed Sep. 6, 2002, Shin Kiuchi et al., Fuji Electric Co., LTD.

(Continued)

*Primary Examiner*—Stephen W. Jackson

(57) ABSTRACT

A composite integrated semiconductor device. In one embodiment, an input surge/noise absorbing circuit absorbs surge from an input signal, an attenuating/level-shifting circuit attenuates or level-shifts the input signal, and an electrical signal converting circuit converts the input signal to an output signal. The input surge/noise absorbing circuit, the attenuating or level-shifting circuit, and the electrical signal converting circuit together form a unit, and a plurality of these units are arranged in parallel in one semiconductor substrate to form the composite integrated semiconductor device, resulting in a reduction in the number of discrete components mounted on a printed circuit board.

20 Claims, 16 Drawing Sheets

FOREIGN PATENT DOCUMENTS

JP  8-172162    7/1996
JP  2000-50486  2/2000

OTHER PUBLICATIONS

Naoki Yaezaea et al., "Surge Protection IC for the Switch Interface ECUs", Fuji Electric Journal, vol. 75, No. 10, pp. 577-580, 2002.

Office Communication from the Japanese Patent Office (dated Apr. 10, 2007).

Office Communication from the Japanese Patent Office (dated Dec. 26, 2006).

* cited by examiner

COMPOSITE INTEGRATED SEMICONDUCTOR DEVICE

CROSS-REFERENCE TO RELATED APPLICATIONS

This application is a continuation of U.S. application Ser. No. 10/235,841, filed Sep. 6, 2002, and now abandoned, which further claims the benefit of priority of Japanese Patent Application No. 2001-269773 filed Sep. 6, 2001, the contents of which are incorporated herein by reference. This application is also related to JP 2002-164890 filed Jun. 5, 2002, the contents of which are incorporated by reference.

BACKGROUND OF THE INVENTION

1. Field of the Invention

The present invention relates to a composite integrated semiconductor device in which there are integrated on the same semiconductor substrate different circuits such as an input surge/noise absorbing circuit for absorbing surge or noise, an attenuating/level-shifting circuit providing attenuation or level-shifting operations, and an electrical signal converting circuit providing an electrical signal converting operation. In particular, the present invention relates to a composite integrated semiconductor device that inputs a signal without surge and noise to a control unit controlling, for example, the electrical equipment of an automobile, with the electric potential level of the signal being matched to the electric potential level of the control unit.

2. Description of the Related Art

Conventionally, circuits such as a surge/noise absorbing circuit for absorbing surge or noise, an attenuating/level-shifting circuit providing an attenuating or a level-shifting operation, an electrical signal converting circuit providing an electrical signal converting operation, etc., are connected to an input side of an electrical control unit (ECU) that controls the electrical equipment of, for example, an automobile. These circuits permit the inputting of a signal without surge and noise, with an electric potential level of the signal matched to an electric potential level of the control unit. FIG. 16 is a block diagram schematically showing a conventional configuration of these functional circuits.

As shown in FIG. 16, a plurality of discrete components 1 such as resistors, capacitors, and diodes are combined, as required, and mounted on a printed circuit board (not shown). External electrical input signals 2 are supplied through the discrete components 1 forming the functional circuits and output as electrical output signals 3, which are supplied to the input terminals 5 of a semiconductor device 4 without surges and noise. Each of the signals is matched to a driving electric potential level of the semiconductor device 4.

In the conventional configuration as described above, however, realization of the circuits having the desired functions has been achieved using a large number of the discrete components 1. This has resulted in an increase in the mounting area of a printed circuit board, and an associated increase in the number of man-hours required to mount the components.

SUMMARY OF THE INVENTION

It is an object of the present invention to provide a composite integrated semiconductor device in which the number of components mounted on a printed circuit board is reduced, decreasing the mounting area on the printed circuit board and the number of man-hours required to mount the components.

The above object can be attained by a composite integrated semiconductor device in which circuits such as an input surge/noise absorbing circuit, an attenuating/level-shifting circuit, and an electrical signal converting circuit are integrated in the same semiconductor substrate.

According to one aspect of the present invention, a composite integrated semiconductor device comprises a plurality of inputting devices, such as input terminals, receiving external electrical signals, a plurality of outputting devices, such as output terminals, for outputting electrical signals, and a plurality of input surge/noise absorbing circuits absorbing surges or noise. Each of the input surge/noise absorbing circuits is connected between one of the inputting devices and a corresponding outputting device. The semiconductor components forming the input surge/noise absorbing circuits are integrated in the same semiconductor substrate.

In another aspect of the present invention, a composite integrated semiconductor device comprises a plurality of inputting devices, such as input terminals, receiving external electrical signals, a plurality of outputting devices, such as output terminals, outputting electrical signals, and a plurality of attenuating/level-shifting circuits providing an attenuating or a level-shifting operation. Each of the attenuating/level-shifting circuits is connected between one of the inputting devices and a corresponding outputting device. The semiconductor components forming the attenuating/level-shifting circuits are integrated in the same semiconductor substrate.

In a further aspect of the present invention, a composite integrated semiconductor device comprises a plurality of inputting devices, such as input terminals, receiving external electrical signals, a plurality of outputting devices, such as output terminals, outputting electrical signals, and a plurality of electrical signal converting circuits providing an electrical signal converting operation. Each of the electrical signal converting circuits is connected between one of the inputting devices and a corresponding outputting device. The semiconductor components forming the electrical signal converting circuits are integrated in the same semiconductor substrate.

In a further aspect of the present invention, a composite integrated semiconductor device comprises a plurality of inputting devices, such as input terminals, receiving external electrical signals, and a plurality of outputting devices, such as output terminals, outputting electrical signals. Each of a plurality of input surge/noise absorbing circuits absorbing surges or noise is connected between one of the inputting devices and a corresponding outputting device. A plurality of attenuating/level-shifting circuits provide an attenuating or a level-shifting operation. Each of the attenuating/level-shifting circuits is connected between one of the inputting devices and a corresponding outputting device. The semiconductor components forming the input surge/noise absorbing circuits and the semiconductor components forming the attenuating/level-shifting circuits are integrated in the same semiconductor substrate.

In a further aspect of the present invention, a composite integrated semiconductor device comprises a plurality of inputting devices that receive an input electrical signal, a plurality of outputting devices that transmit an output electrical signal, a plurality of input surge/noise absorbing circuits that absorb surge or noise of the input electrical signal, and a plurality of electrical signal converting circuits that convert the input electrical signal to the output electrical signal. Each of the input surge/noise absorbing circuits is connected between respective ones of the inputting devices and corresponding outputting devices. Also, each of the electrical signal converting circuits is connected between respective ones of the inputting devices and corresponding outputting devices. A plurality of semiconductor components form the input surge/noise absorbing circuits and the electrical signal converting circuits and are integrated in the same semiconductor substrate.

In a further aspect of the present invention, a composite integrated semiconductor device comprises a plurality of inputting devices that receive an input electrical signal, a plurality of outputting devices that transmit an output electrical signal, a plurality of attenuating/level-shifting circuits that attenuate or level-shift the input electrical signal, and a plurality of electrical signal converting circuits that convert the input electrical signal to the output electrical signal. Each of the attenuating/level-shifting circuits is connected between respective ones of the inputting devices and corresponding outputting devices. Also, each of the electrical signal converting circuits is connected between respective ones of the inputting devices and corresponding outputting devices. A plurality of semiconductor components form the attenuating/level-shifting circuits and the electrical signal converting circuits and are integrated in the same semiconductor substrate.

In a further aspect of the present invention, a composite integrated semiconductor device comprises a plurality of inputting devices that receive an input electrical signal, a plurality of outputting devices that transmit an output electrical signal, a plurality of input surge/noise absorbing circuits that absorb surge or noise of the input electrical signal, a plurality of attenuating/level-shifting circuits that attenuate or level-shift the input electrical signal, and a plurality of electrical signal converting circuits that convert the input electrical signal to the output electrical signal. Each of the input surge/noise absorbing circuits, the attenuating/level-shifting circuits, and the electrical signal converting circuits is connected between respective ones of the inputting devices and corresponding outputting devices. A plurality of semiconductor components form the input surge/noise absorbing circuits, the attenuating/level-shifting circuits, and the electrical signal converting circuits, and are integrated in the same semiconductor substrate.

In each of the aspects described above, the input surge/noise absorbing circuits are able to withstand an electrostatic surge of approximately ±0.5 kV to 15 kV or more at approximately 150 pF and 500Ω, or an electrostatic surge of approximately ±1000V or more at approximately 100 pF and 1500Ω, or an electromagnetic wave noise of approximately 20 to 100V/m or more at approximately 10 kHz to 200 MHz. Also, the composite integrated semiconductor device according to the preferred embodiment of the present invention may output the electrical signals through the outputting devices to a controller controlling the electrical equipment of an automobile, for example. The position of the outputting devices may form an angle of about 90° or more with respect to the position of the inputting devices. In addition, the semiconductor substrate on which all the semiconductor components are integrated may be sealed using a resin or ceramic.

In each of the aspects describe above, the input surge/noise absorbing circuits, the attenuating/level-shifting circuits, and the electrical signal converting circuits are integrated on the same semiconductor substrate. This reduces the number of components mounted on a printed circuit board compared with a conventional circuit configuration in which semiconductor devices having discrete components are combined.

These together with other aspects and advantages that will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1:
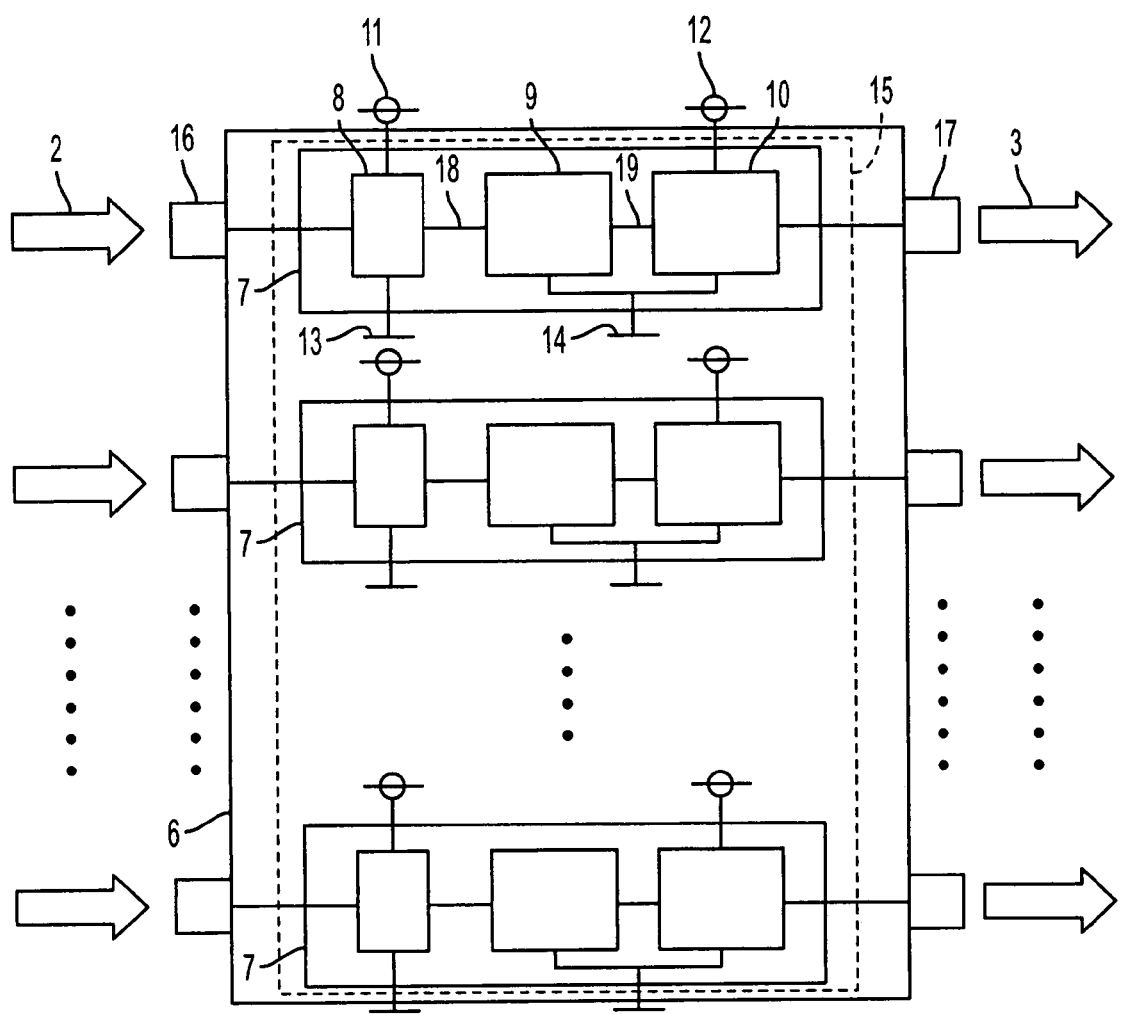
FIG. 1 is a block diagram showing an example of the configuration of a composite integrated semiconductor device according to an embodiment of the present invention.
Figure 2:
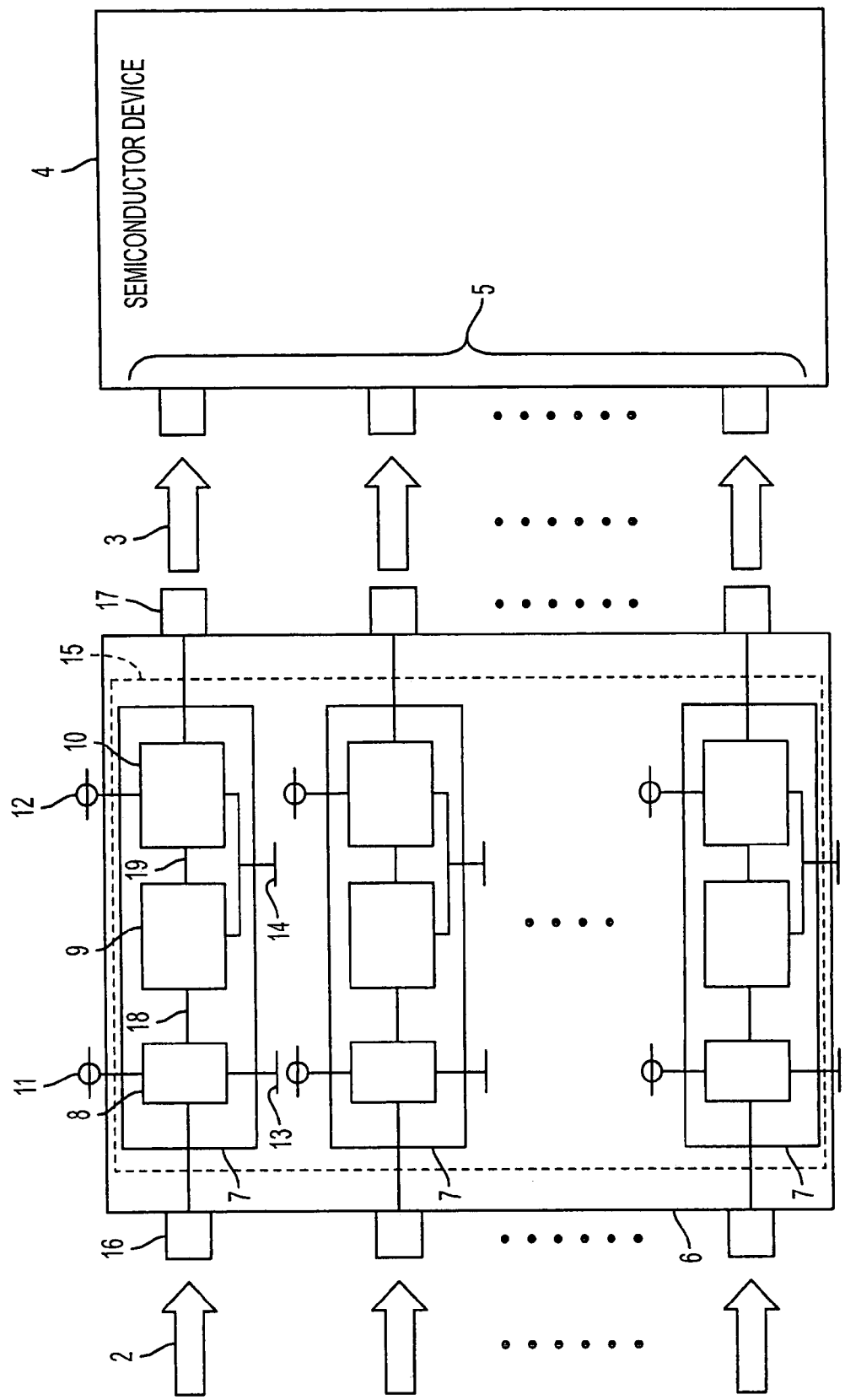
FIG. 2 is a block diagram schematically showing an example of an interface between the composite integrated semiconductor device of FIG. 1 and another semiconductor device.

FIG. 1 is a block diagram showing an example configuration of the composite integrated semiconductor device 15 according to an embodiment of the present invention. FIG. 2 is a block diagram schematically showing an example of an interface between the composite integrated semiconductor device 15 of FIG. 1 and another semiconductor device 4. As shown in FIG. 1 and FIG. 2, the composite integrated semiconductor device 15 is comprised of a plurality of integrated circuits 7. The integrated circuits 7 are connected in parallel between reference electric potentials formed in the same semiconductor substrate, and sealed in a semiconductor package 6.

Each integrated circuit 7 has a unit structure with a configuration including an input surge/noise absorbing circuit 8 absorbing surge or noise, an attenuating/level-shifting circuit 9 providing an attenuating or a level-shifting operation, and an electrical signal converting circuit 10 providing an electrical signal converting operation. A reference electric potential of the input surge/noise absorbing circuit 8 differs from a reference electric potential of the electrical signal converting circuit 10. Thus, the input surge/noise absorbing circuit 8 and the electrical signal converting circuit 10 are connected via the attenuating/level-shifting circuit 9.

Referring to FIG. 1 and FIG. 2, each input terminal 16 (i.e., inputting device) is projected from the semiconductor package 6. Each output terminal 17 (i.e., outputting device) is projected from another side of the semiconductor package 6. The input surge/noise absorbing circuit 8 of each unit 7 absorbs electrostatic surge or electromagnetic wave noise applied between an input terminal 16 and a grounding line 13, or between the grounding line 13 and a first power source line 11.

As shown in FIG. 2, an external electrical input signal 2 transmitted to each of the input terminals 16 of the composite integrated semiconductor device 15, to the input surge/noise absorbing circuit 8, and then to an input line 18 of the attenuating/level-shifting circuit 9. The attenuating/level-shifting circuit 9 carries out attenuation or level-shifting of a transient and DC voltage component of the electrical input signal 2. An electrical signal output from the attenuating/level-shifting circuit 9 is transmitted to an input line 19 of the electrical signal converting circuit 10.

The electrical signal converting circuit 10 converts the electrical signal from the attenuating/level-shifting circuit 9 to an electrical output signal 3 for which an applied voltage of a second power source line 12 to a grounding line 14 is a reference voltage. The electrical output signals 3 from each of the units 7 are output through the output terminals 17 of the composite integrated semiconductor device 15 and transmitted to the input terminals 5 of a semiconductor device 4, such as a microcomputer or a large-scale integrated (LSI) circuit.

Figure 3:
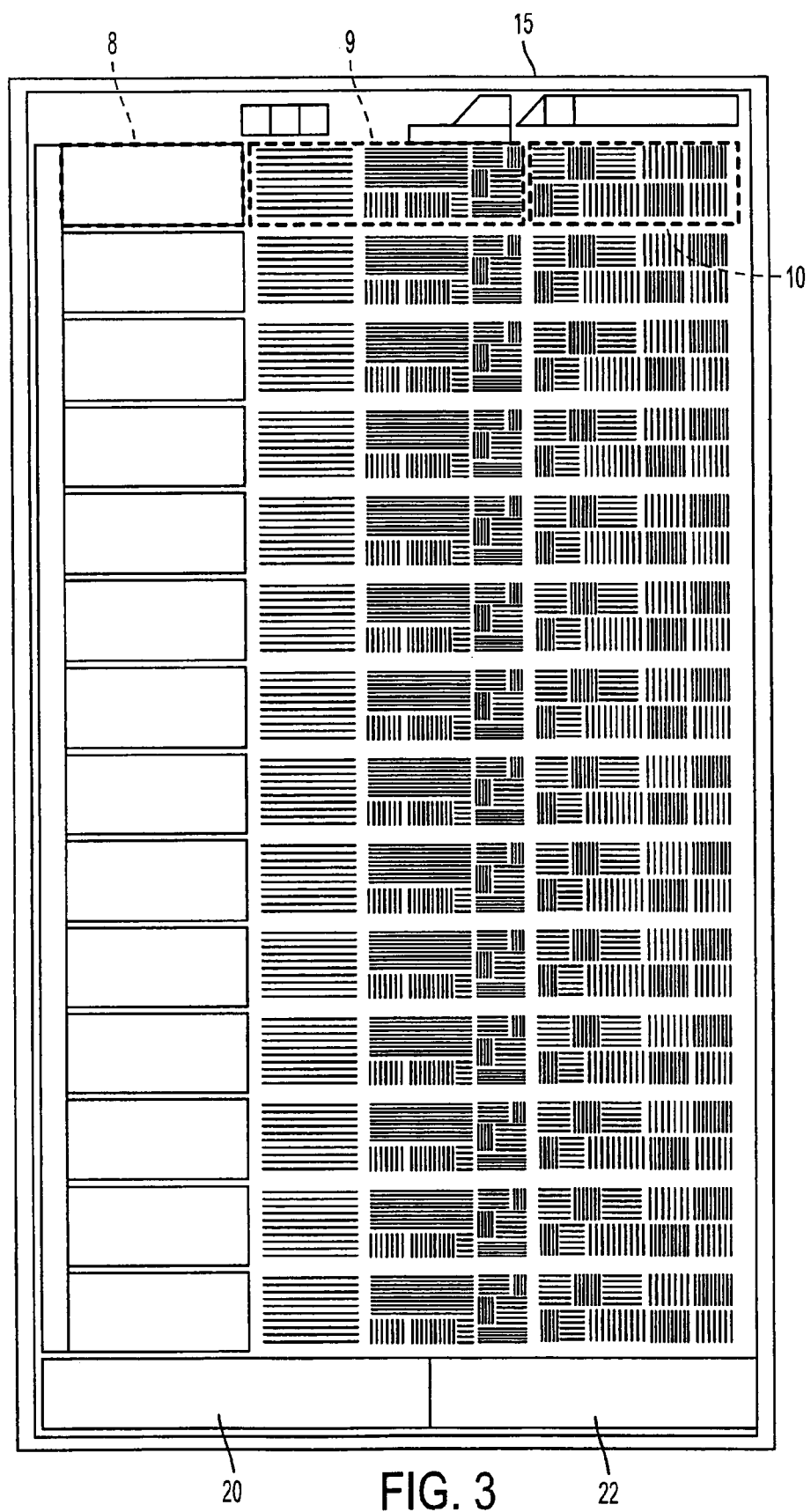
FIG. 3 is a plan view of a chip showing an example of a chip layout of the composite integrated semiconductor device of FIG. 1.

FIG. 3 is a plan view of a chip showing an example of a chip layout of the composite integrated semiconductor device according to an embodiment of the invention. In the example of the semiconductor chip forming the composite integrated semiconductor device 15 of FIG. 3, an input surge/noise absorbing circuit 8, an attenuating/level-shifting circuit 9, and an electrical signal converting circuit 10 are aligned in the lateral direction of the chip (i.e., left-to-right direction in FIG. 3) to form an integrated circuit. The integrated circuits that are formed are aligned in the longitudinal direction of the chip (i.e., top-to-bottom direction in FIG. 3).

The chip layout of FIG. 3 shows two regions 20 and 22 aligned laterally at the bottom of FIG. 3. Region 20 is a ground for the input surge/noise absorbing circuits 8, and region 22 is a ground for the electrical signal converting circuits 10. Two regions 20 and 22 are formed because of a difference in respective reference electric potentials.

Figure 4:
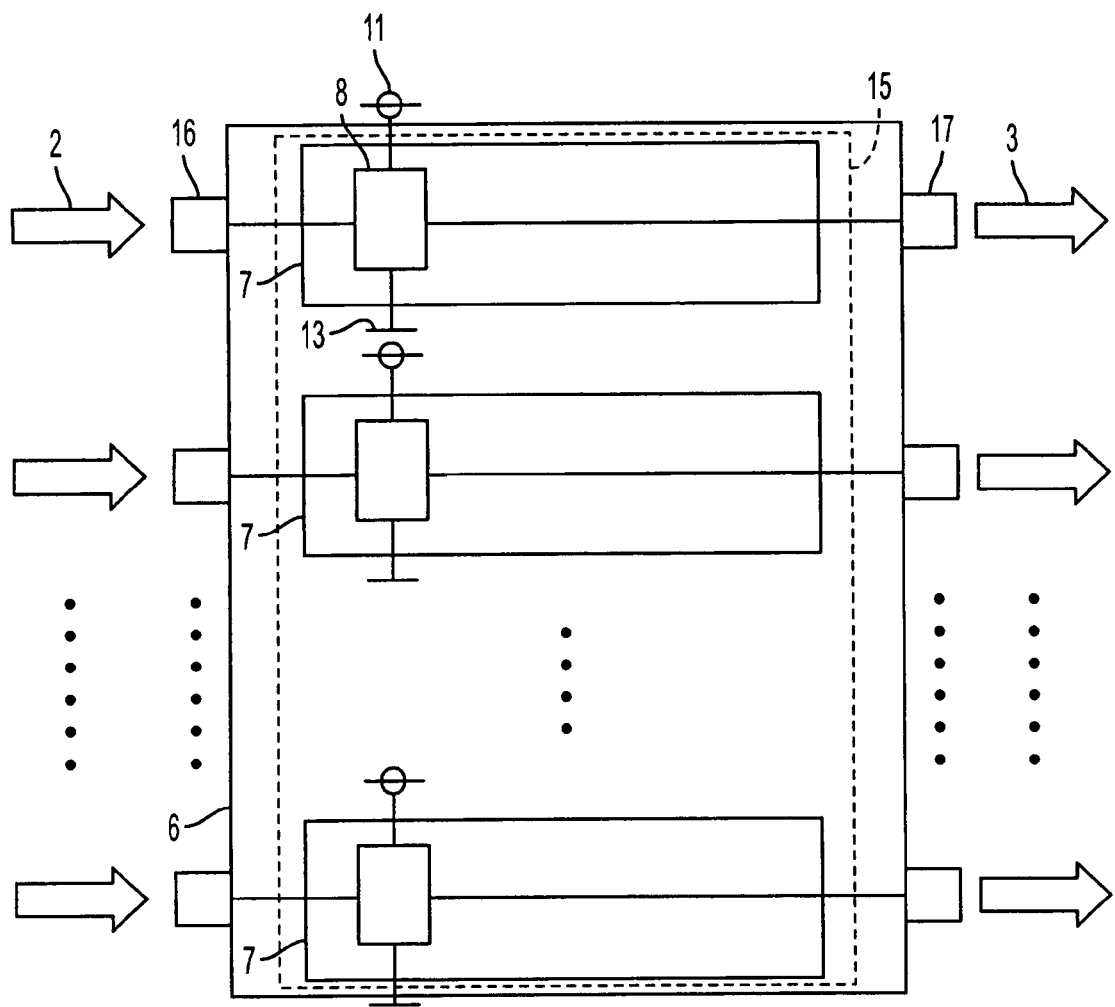
FIG. 4 is a block diagram showing another example of a configuration of the composite integrated semiconductor device according an embodiment of to the present invention.

As shown in FIG. 4, each integrated circuit 7, which is a unit structure of the composite integrated semiconductor device 15, may be formed with only, for example, the input surge/noise absorbing circuit 8. Similarly, although not shown, each integrated circuit 7 may be formed with only the attenuating/level-shifting circuit 9, or only with the electrical signal converting circuit 10. Furthermore, each integrated circuit 7 may be formed with any two of the input surge/noise absorbing circuit 8, the attenuating/level-shifting circuit 9, and the electrical signal converting circuit 10.

Figure 5:
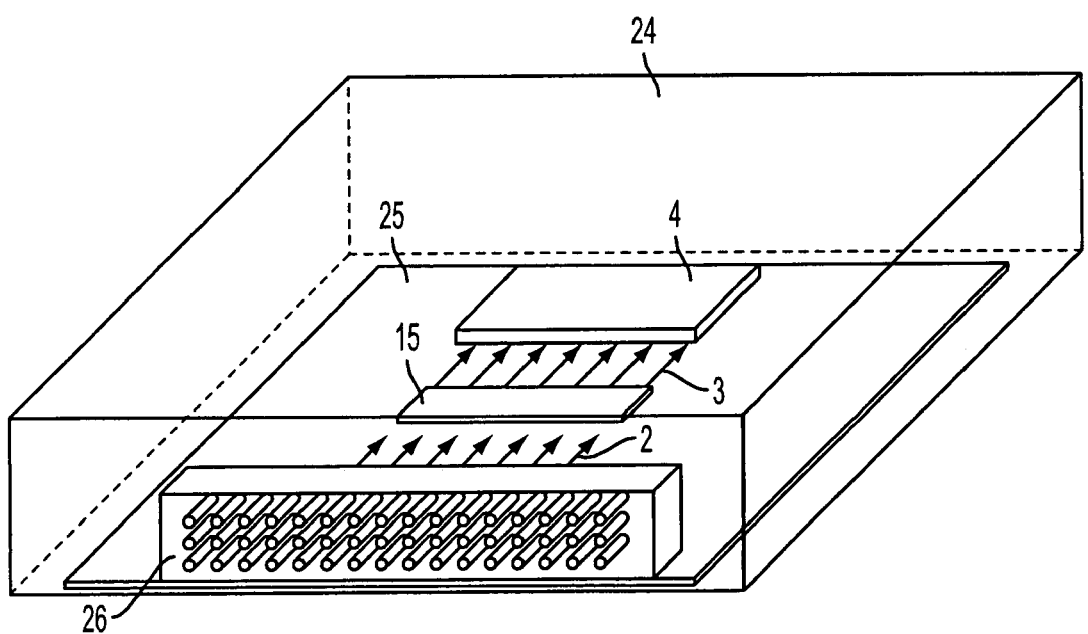
FIG. 5 is a perspective view showing the composite integrated semiconductor device according to an embodiment of the present invention as applied to a control unit for the electrical equipment of an automobile.

FIG. 5 shows an example of applying the composite integrated semiconductor device according to an embodiment of the present invention to the electrical control unit (EDU) that controls the electrical equipment of an automobile, such as the engine, the automatic transmission, the anti-lock braking system, etc. In FIG. 5, the control unit 24 is drawn as being transparent so that the inner structure can be seen. In the control unit 24, the composite integrated semiconductor device 15 and a semiconductor device 4, which is a control device such as a microcomputer, are mounted on a printed circuit board 25. A connector 26 for the control unit 24 is also mounted on the printed circuit board 25.

Electrical input signals 2 are input from outside the control unit 24 to the connector 26. The semiconductor device 4 uses the electrical input signals 2 to gather information, to determine equipment status, etc. for the automobile. Therefore, the composite integrated semiconductor device 15 is positioned between the connector 26 and the semiconductor device 4. When a plurality of input signals 2 with electric potentials differing from one another are input to the composite integrated semiconductor device 15, resistors (not shown) are connected to the input terminals 16 of the composite integrated semiconductor device 15, with each of the input terminals 16 being matched to each of the input signals 2.

Figure 16:
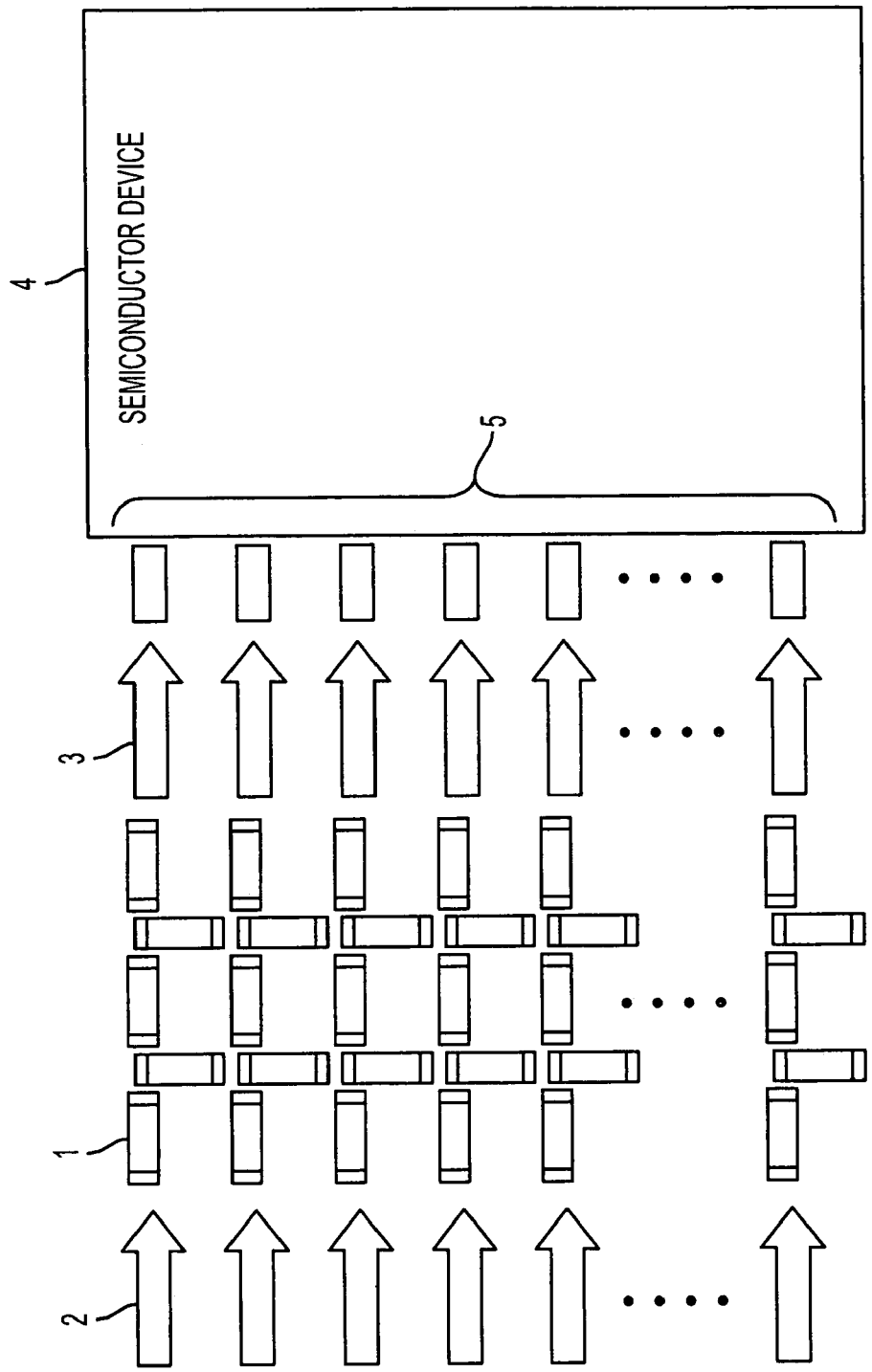
FIG. 16 is a block diagram schematically showing an interface between a functional circuit comprising a plurality of conventional discrete semiconductor components and a semiconductor device.

The connector 26 receives an electrostatic discharge pulse and electromagnetic interference noise. However, the composite integrated semiconductor device 15 removes the electrostatic discharge pulse and the electromagnetic interference noise. Then, electrical signals without the electrostatic discharge pulse and the electromagnetic interference noise are converted in the composite integrated semiconductor device 15 to signals (i.e., electrical output signals 3) having an adequate electric potential level for transmission to the input terminals of the semiconductor device 4. By using the composite integrated semiconductor device 15, as compared with the conventional configuration of FIG. 16, in which equivalent functions are provided using a plurality of discrete components, the mounting area of the semiconductor components 1 occupying the printed circuit board 25 is decreased, together with a reduction in the cost of mounting the semiconductor components.

When the composite integrated semiconductor device 15 according to an embodiment of the present invention is applied to the electrical equipment of an automobile, the composite integrated semiconductor device 15 is able to withstand electrostatic discharge pulses of approximately ±0.5 kV to 15 kV or more at approximately 150 pF and 500Ω in accordance with D001-94 of the Japan Automobile Standard Organization (JASO), or to withstand electrostatic discharge pulses of approximately ±1000V or more at 100 pF and approximately 1500Ω in accordance with standard ED-4701-1 of the Electronic Industries Association of Japan (EIAJ). Moreover, the composite integrated semiconductor device 15 is able to withstand electromagnetic interferences of approximately 20 to 100V/m or more at approximately 10 kHz to 200 MHz.

Figure 6:
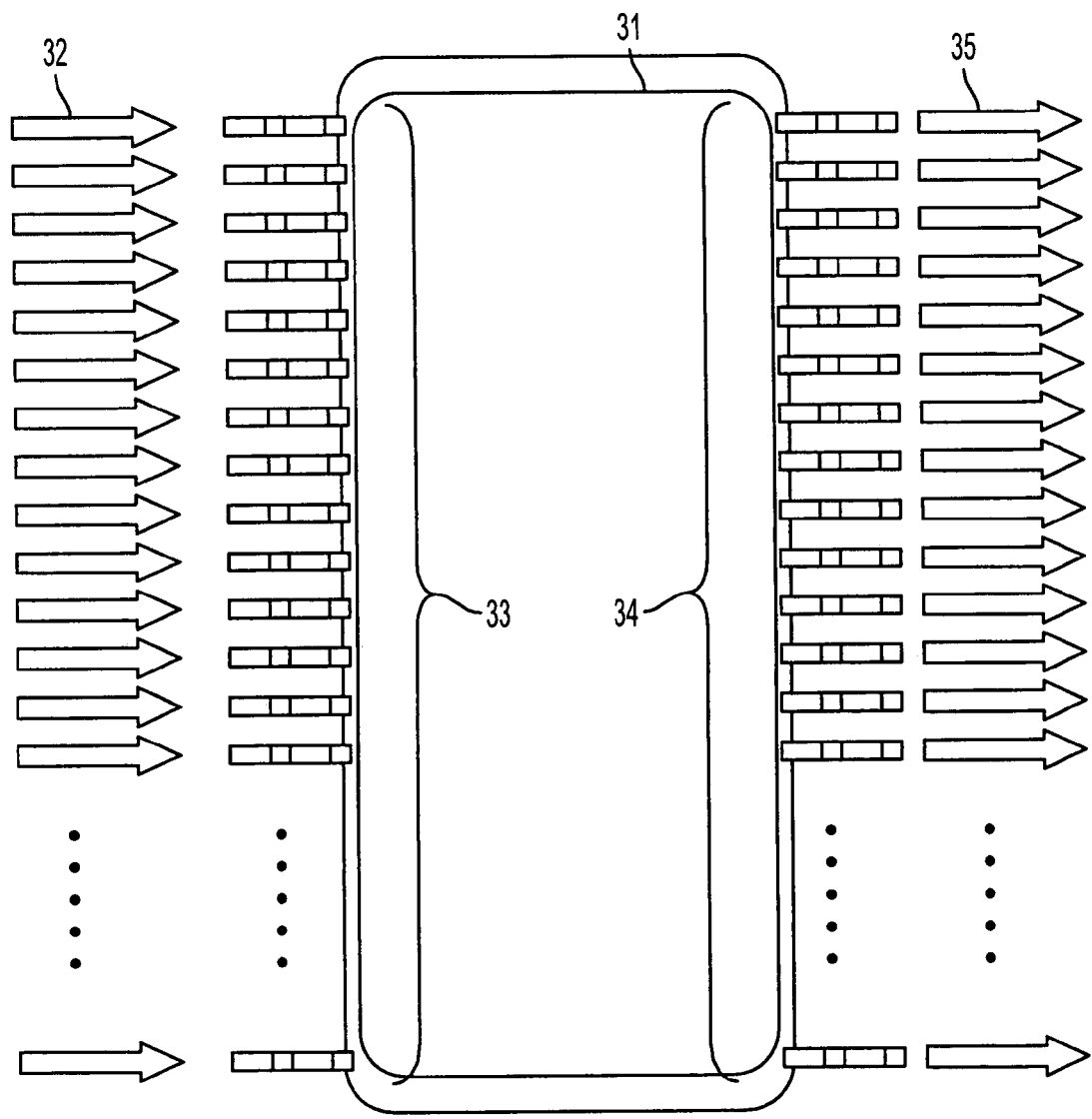
FIG. 6 is a plan view showing a Small Outline Package (SOP) for sealing the composite integrated semiconductor device according to an embodiment of the present invention.

Next, details are provided regarding the semiconductor package 6. FIG. 6 is a plan view showing an example of sealing the composite integrated semiconductor device 15 of an embodiment of the present invention in a Small Outline Package (SOP) 31. As shown in FIG. 6, a plurality of output terminals 34 are positioned about 180° from a plurality of input terminals 33, thereby preventing surge and noise applied to the input terminals 33 from being transmitted to the output terminals 34. In FIG. 6, arrows with reference numerals 32 and 35 represent the electrical input signals and the electrical output signals, respectively.

Figure 7:
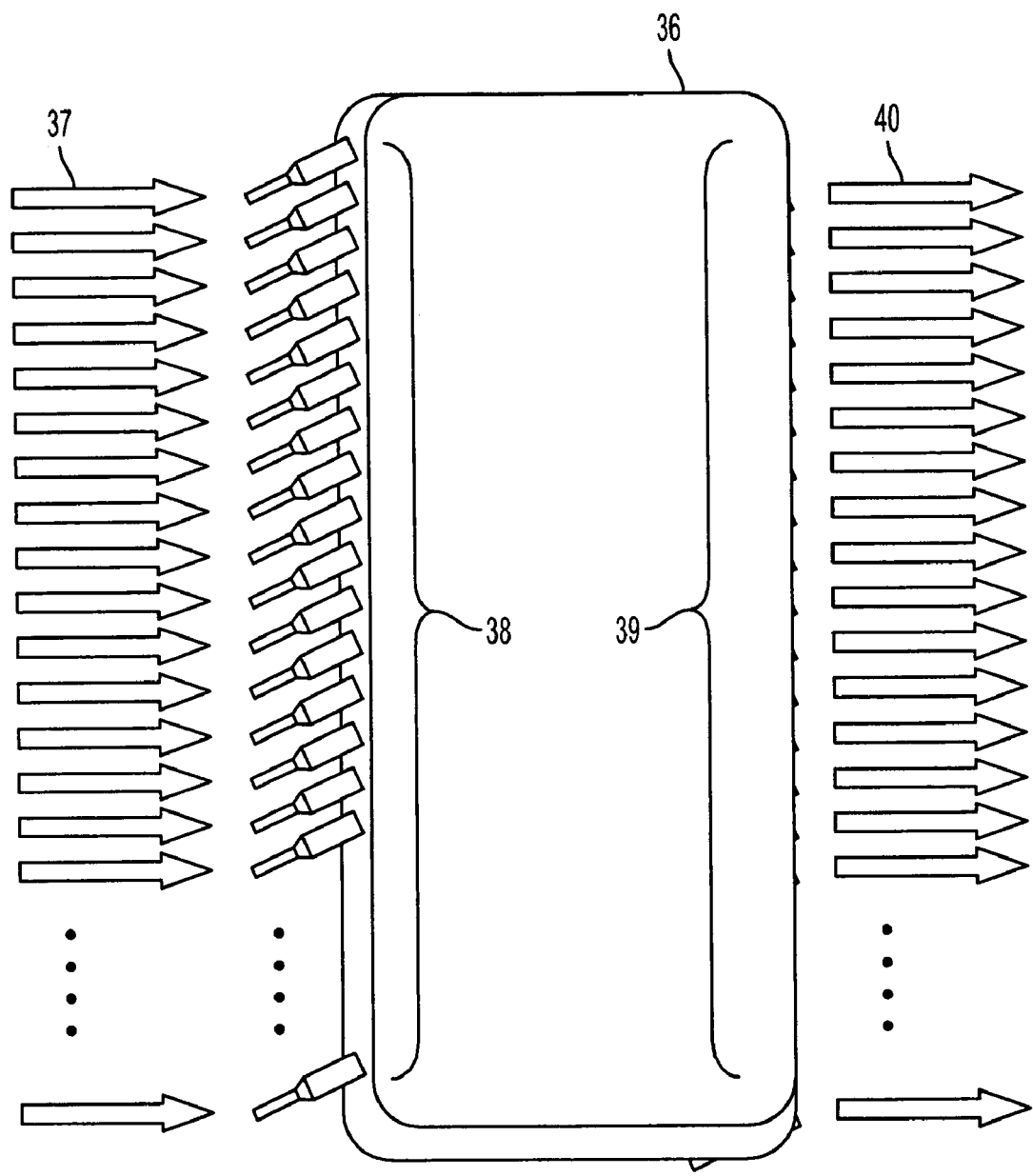
FIG. 7 is a perspective view showing a Dual Inline Package (DIP) for sealing the composite integrated semiconductor device according to an embodiment of the present invention.

FIG. 7 is a perspective view showing an example of sealing the composite integrated semiconductor device 15 in a Dual In-Line Package (DIP) 36. As shown in FIG. 7, a plurality of output terminals 39 are positioned about 180° from a plurality of input terminals 38, thereby preventing surge and noise applied to the input terminals 38 from being transmitted to the output terminals 39. In FIG. 7, arrows with reference numerals 37 and 40 represent the electrical input signals and the electrical output signals, respectively.

Figure 8:
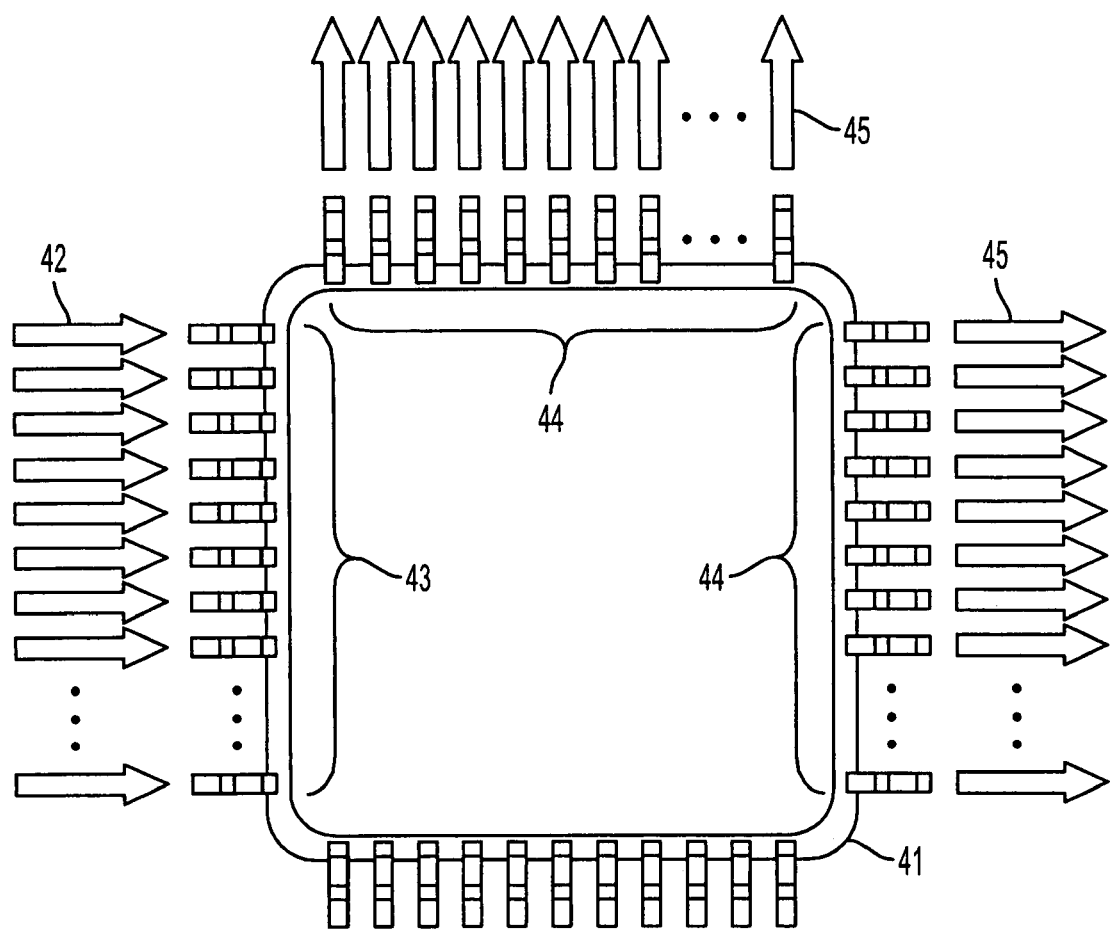
FIG. 8 is a plan view showing a Quad Flat Package (QFP) for sealing the composite integrated semiconductor device according to an embodiment of the present invention.

FIG. 8 is a plan view showing an example of sealing the composite integrated semiconductor device 15 in a Quad Flat Package (QFP) 41. As shown in FIG. 8, a plurality of output terminals 44 are separated from a plurality of input terminals 43 in one or more different directions (two directions in the example shown in FIG. 8) by an angle of about 90° or more. In FIG. 8, arrows with reference numerals 42 and 45 represent the electrical input signals and the electrical output signals, respectively. Alternatively, one set of input or output terminals may protrude from a side of the semiconductor package 6 and the other set of terminals may protrude from the bottom of the semiconductor package 6.

Figure 9:
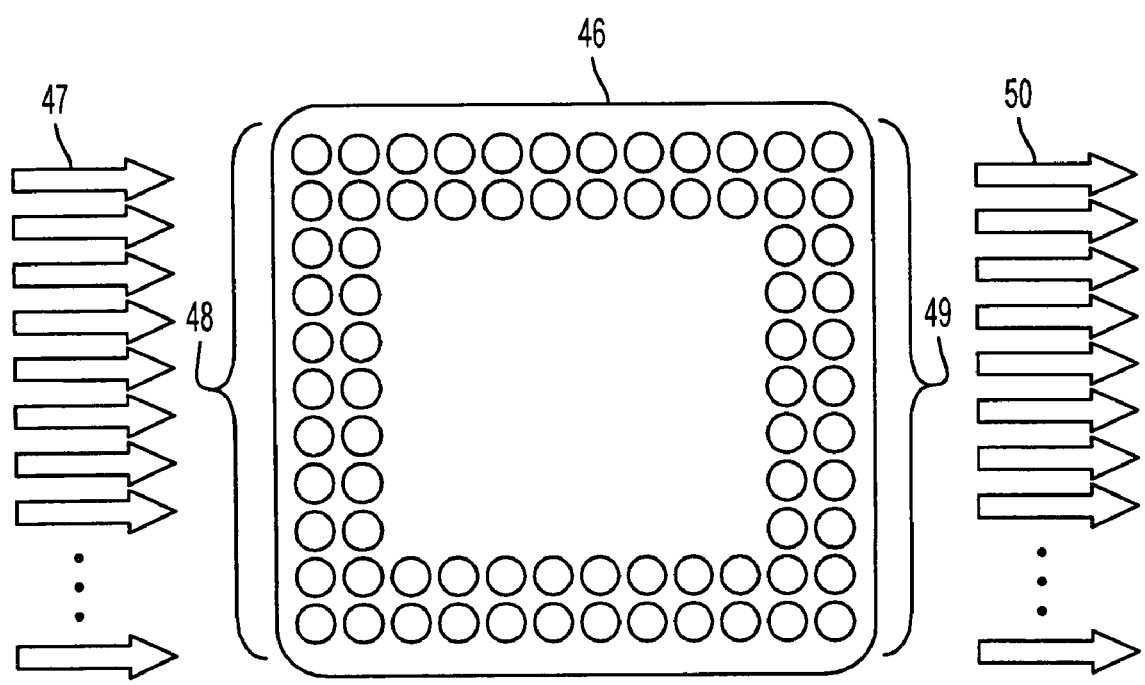
FIG. 9 is a plan view showing a Ball Grid Array (BGA) package or a Chip Size Package (CSP) for sealing the composite integrated semiconductor device according to an embodiment of the present invention.

FIG. 9 is a plan view showing an example of sealing the composite integrated semiconductor device 15 in a Ball Grid Array (BGA) package 46 or a Chip Size Package (CSP) 46. As shown in FIG. 9, a plurality of output terminals 49 are disposed on a side different from a side provided with a plurality of input terminals 48 by an angle of approximately 90° or more. In the example shown in FIG. 9, the output terminals 49 and the input terminals 48 are located on opposite sides of the composite integrated semiconductor device 15. In FIG. 9, reference numeral 47 denotes the electrical input signals and reference numeral 50 denotes the electrical output signals.

In the various examples of semiconductor packages 6 as described above, a plurality of the input terminals are collected together on one side of the semiconductor package 6 and a plurality of the output terminals are collected together on the other side. Any power source terminals and grounding terminals are located at the remaining sides. In addition, the semiconductor substrate on which all the semiconductor components are integrated may be sealed using a resin or ceramic.

FIG. 10 through FIG. 14 are circuit diagrams showing specific circuit configurations for the input surge/noise absorbing circuit 8, the attenuating/level-shifting circuit 9, and the electrical signal converting circuit 10. Each of FIGS. 10 through 14 shows one of the integrated circuits 7, which is a unit structure of the composite integrated semiconductor device 15. The electrical signal converting circuit 10 is not shown in FIGS. 11 and 12.

Figure 10:
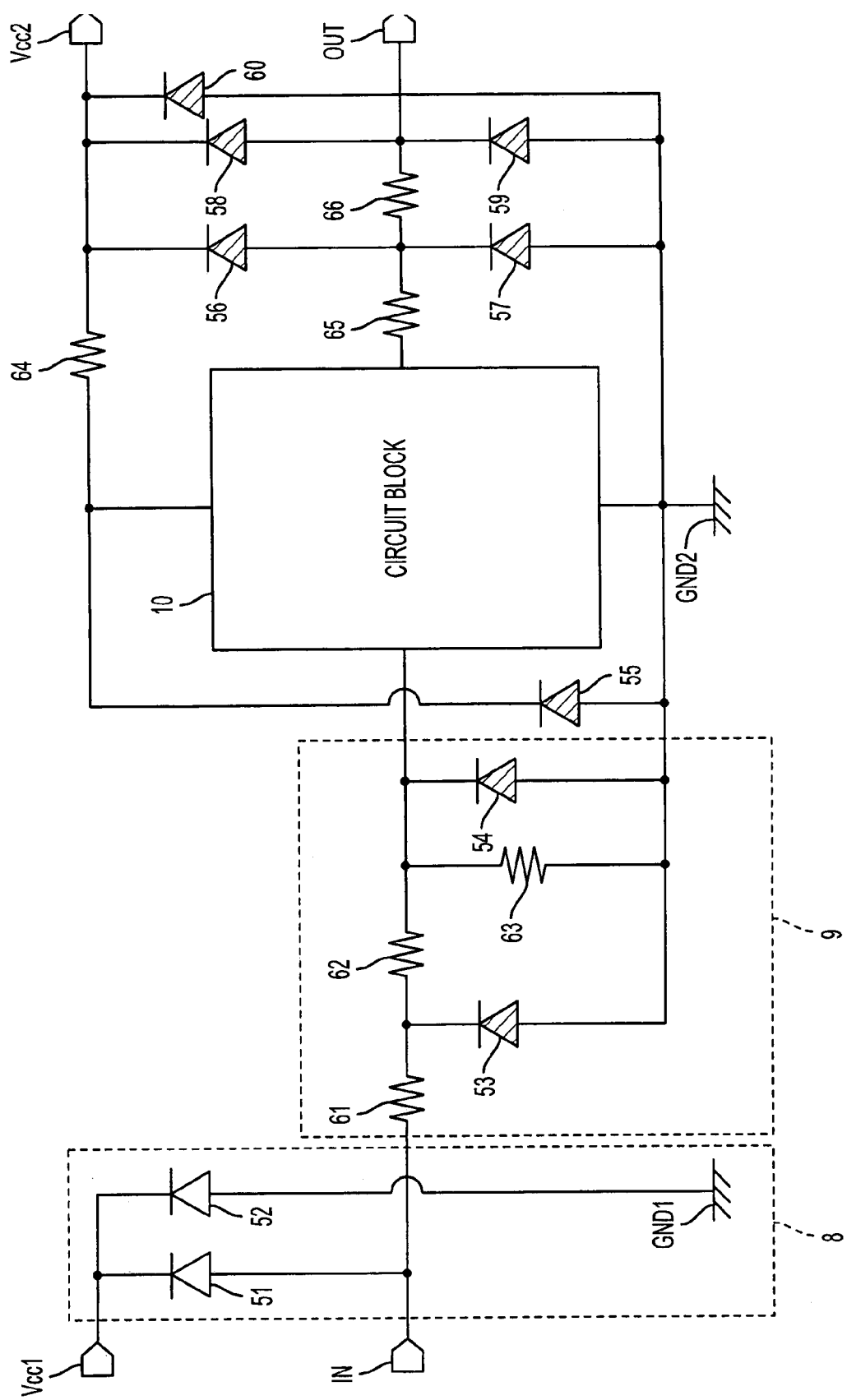
FIG. 10 is a circuit diagram showing an example of the configuration of one of a plurality of units of the composite integrated semiconductor device according to an embodiment of the present invention.
Figure 11:
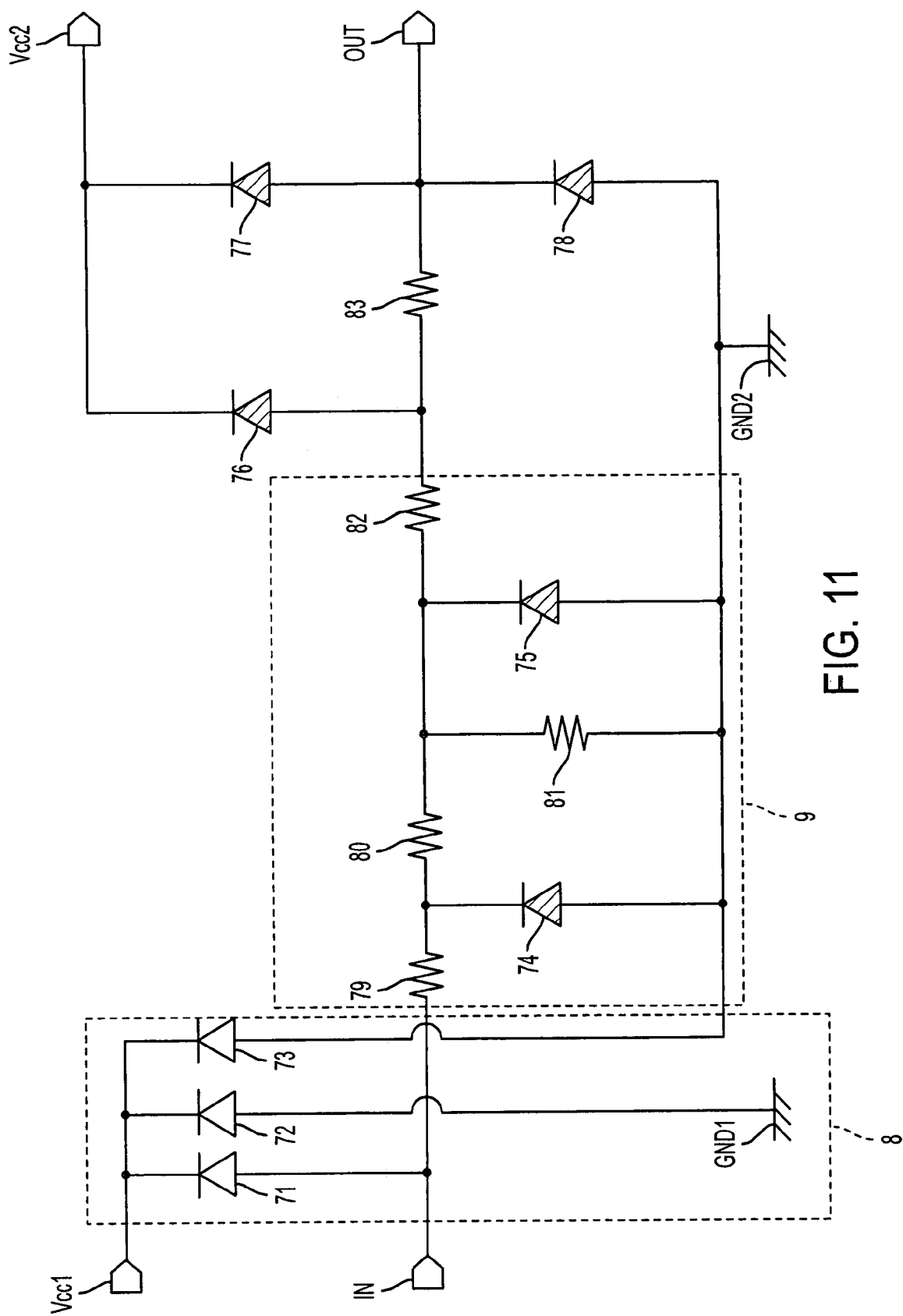
FIG. 11 is a circuit diagram showing another example of the configuration of a unit of the composite integrated semiconductor device according to an embodiment of the present invention.
Figure 12:
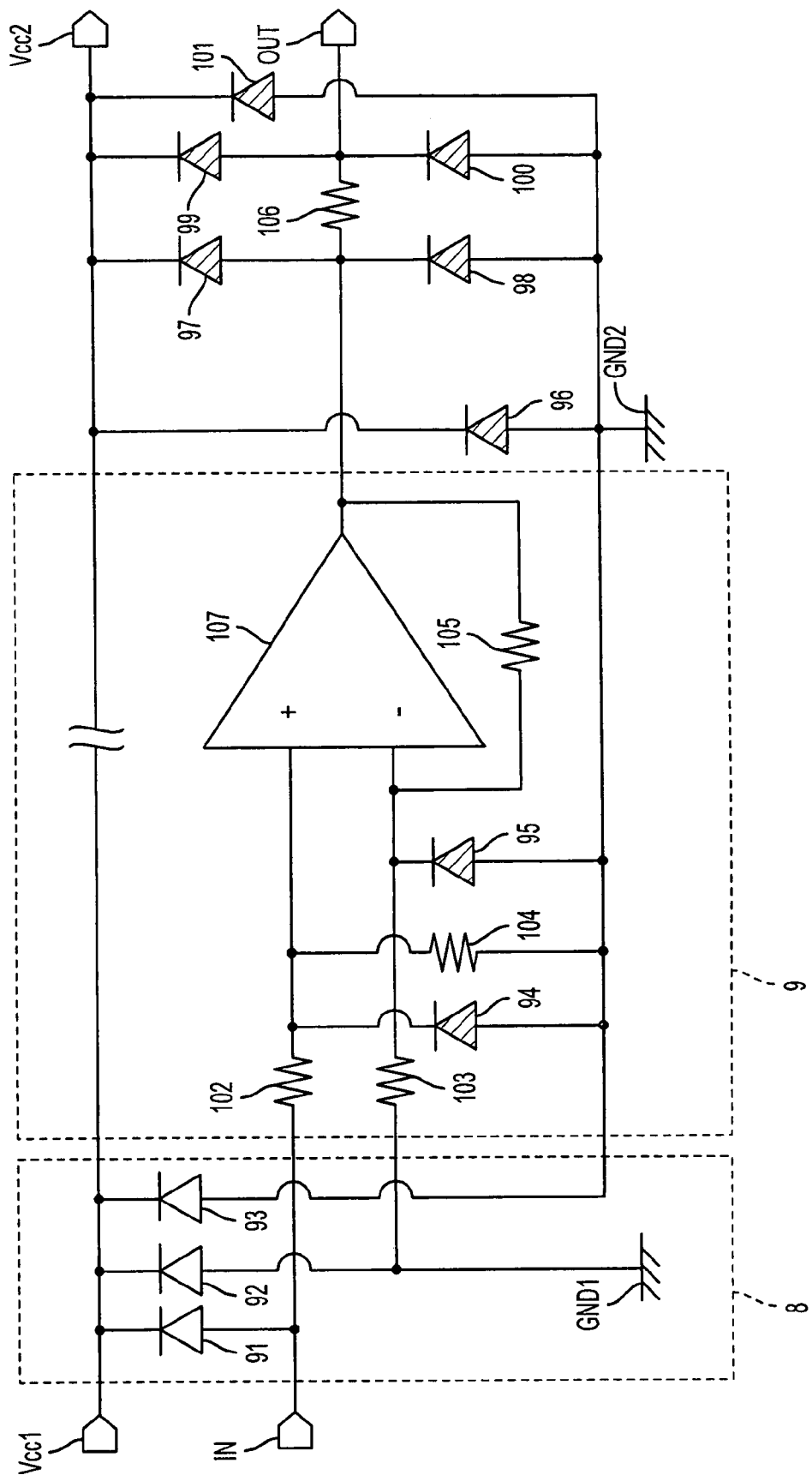
FIG. 12 is a circuit diagram showing another example of the configuration of a unit of the composite integrated semiconductor device according to an embodiment of the present invention.
Figure 13:
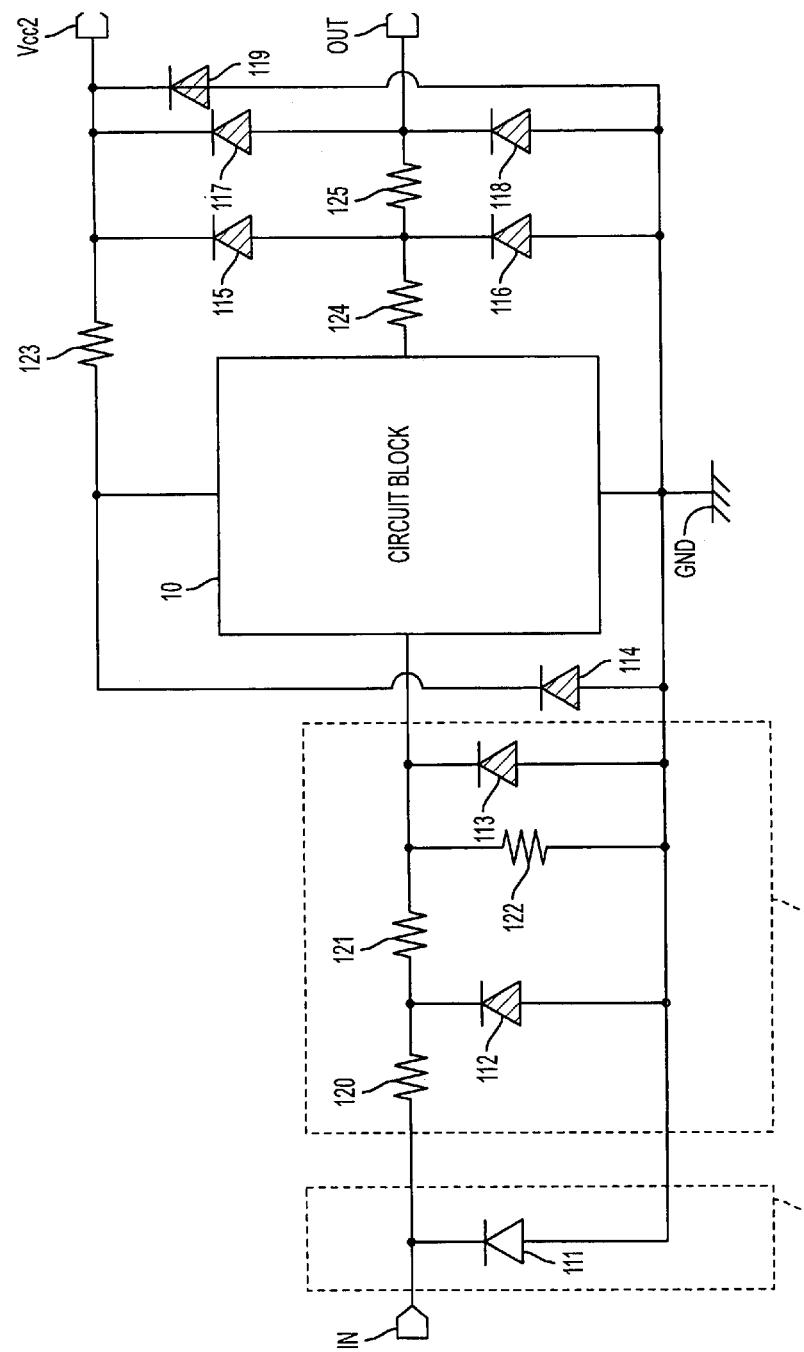
FIG. 13 is a circuit diagram showing another example of the configuration of a unit of the composite integrated semiconductor device according to an embodiment of the present invention.

The example shown in FIG. 10 has ten diodes 51 to 60, six resistors 61 to 66, and a circuit block 10, which is the electrical signal converting circuit 10 (described below). The example shown in FIG. 11 has eight diodes 71 to 78 and five resistors 79 to 83. The example shown in FIG. 12 has eleven diodes 91 to 101, five resistors 102 to 106, and an operational amplifier 107. The example shown in FIG. 13 has nine diodes 111 to 119, six resistors 120 to 125, and an electrical signal converting circuit 10 (circuit block). The example shown in FIG. 14 has three diodes 131 to 133, two resistors 134 and 135, seven MOSFETs 136 to 142, and a capacitor 143. The circuit blocks 10 of FIGS. 10 and 13 are formed using conventional techniques and may include circuits such as an operational amplifier (OP amp) 151, a buffer 152, an inverter 153, a logic gate 154, a filter 155, and a ROM 156, as shown in FIG. 15.

The components of the circuits shown in FIGS. 10-14 are formed using conventional techniques. For example, the diodes 51 to 60, 71 to 78, 91 to 101, 111 to 119, and 131 to 133 may be formed, for example, using PN junction structures having a p-type diffused region and an n-type diffused region, or by MOSFETs having a main terminal and a gate that are short-circuited. The resistors 61 to 66, 79 to 83, 102 to 106, 120 to 125, 134, and 135 may be formed of, for example, diffused resistors having a diffused region formed in a semiconductor substrate, resistors formed of polysilicon, or well resistors having a well formed in a semiconductor substrate.

Figure 14:
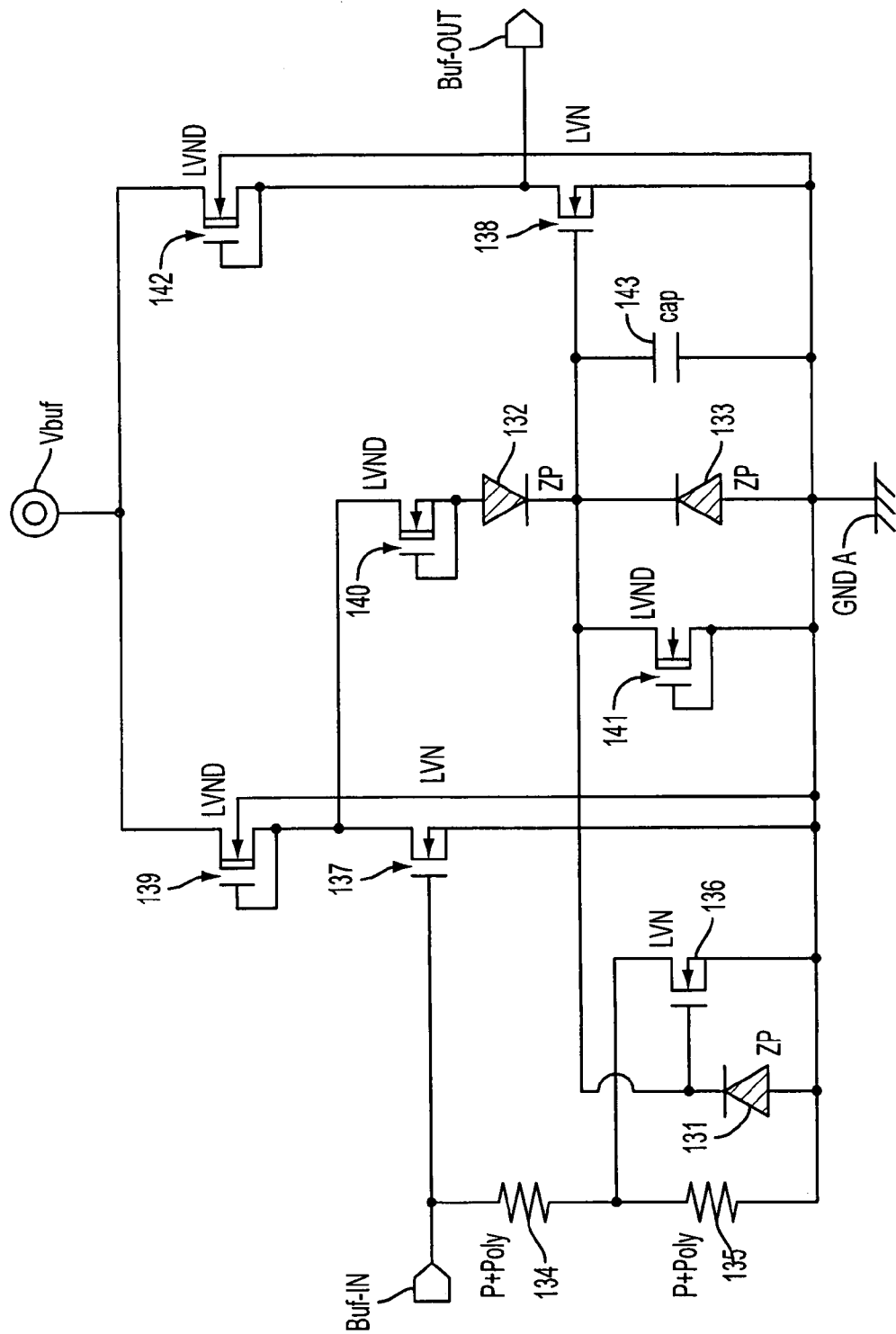
FIG. 14 is a circuit diagram showing another example of the configuration of a unit of the composite integrated semiconductor device according to an embodiment of the present invention.
Figure 15:
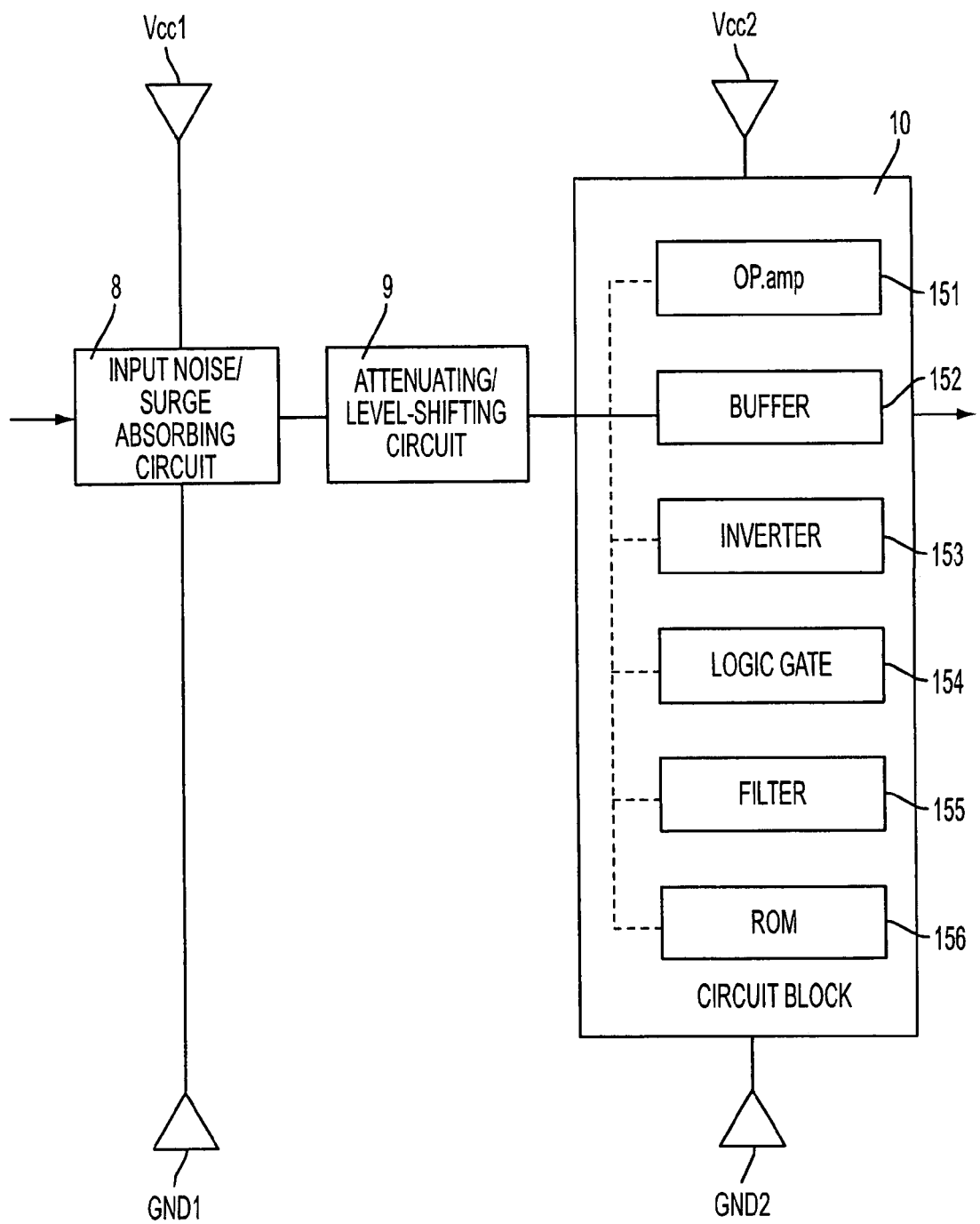
FIG. 15 is a block diagram showing a configuration of a circuit block shown in FIG. 10 and FIG. 13.

Furthermore, the capacitor 143 of FIG. 14 may be formed by, for example, a well with polysilicon layered thereon through an insulation layer. In addition, the OP amp 151, the buffer 152, the inverter 153, the logic gate 154, the filter 155, and the ROM 156 may be formed by MOSFETs, as well as by the above-described resistors and capacitors. Voltages at various parts of the circuits in FIGS. 10-13 are provided as approximately 24V at IN, 18V at Vcc1, 7V at Vcc2, and 4.0 to 5.3V at OUT.

According to the various aspects of the present invention as described above, the input surge/noise absorbing circuit 8, the attenuating/level-shifting circuit 9, and the electrical signal converting circuit 10 are integrated in the same semiconductor substrate. Thus, the number of components mounted on a printed circuit board is reduced compared with a conventional circuit configuration in which semiconductor devices are formed by combining a plurality of discrete components. As a result, the mounting area on the printed circuit board and the number of man-hours required to mount the components are reduced.

The present invention is not limited to the above described aspects, but may be modified, provided the circuits at stages preceding a microcomputer, such as the circuit for absorbing noise and surge and the circuit for making electric signal levels match those of the microcomputer, are integrated in the same semiconductor substrate.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A composite integrated semiconductor device being connected to a plurality of inputting terminals of a semiconductor device at front of the input terminals, comprising:
   a plurality of inputting devices receiving an input electrical signal;
   a plurality of outputting devices transmitting an output electrical signal to the plurality of inputting terminals of a semiconductor device;
   a plurality of input surge/noise absorbing circuits to absorb surge or noise of the input electrical signal, each of the input surge/noise absorbing circuits being connected between respective ones of the inputting devices and corresponding outputting devices, each of the input surge/noise absorbing circuits including a first diode being connected between a power source line and the inputting device and a second diode being connected between the power source line and a ground, respectively; and
   a plurality of attenuating/level-shifting circuits to attenuate the input electrical signal, each of the attenuating circuits being connected between respective ones of the inputting devices and corresponding outputting devices,
   wherein each inputting device, input surge/noise absorbing circuit, attenuating/level-shifting circuit, and outputting device comprise an integrated circuit, and
   wherein the integrated circuits are arranged in a line at each of the inputting terminals and the integrated circuits are formed in a semiconductor substrate.

2. The composite integrated semiconductor device as claimed in claim 1, wherein the input surge/noise absorbing circuit is able to withstand an electrostatic discharge capability of approximately ±0.5 kV to 15 kV at approximately 150 pF and 500Ω.

3. The composite integrated semiconductor device as claimed in claim 1, wherein the input surge/noise absorbing circuit is able to withstand an electrostatic discharge capability of approximately ±1000V at approximately 100 pF and 1500Ω.

4. The composite integrated semiconductor device as claimed in claim 1, wherein the input surge/noise absorbing circuit is able to withstand an electromagnetic compatibility capability of approximately 20 to 100 V/m at approximately 10 kHz to 200 MHz.

5. The composite integrated semiconductor device as claimed in claim 1, wherein the outputting devices are positioned at an angle of about 90° or more with respect to a position of the inputting devices.

6. A composite integrated semiconductor device as claimed in claim 1, wherein the input surge/noise absorbing circuit comprises:
   a first diode, an anode of the first diode being connected to the inputting terminal and a cathode of the first diode being connected to a power terminal; and
   a second diode, an anode of the second diode being connected to a ground and a cathode of the second diode being connected to the power terminal.

7. The composite integrated semiconductor device as claimed in claim 6, wherein the input surge/noise absorbing circuit is able to withstand an electrostatic discharge capability of approximately ±0.5 kV to 15 kV at approximately 150 pF and 500Ω.

8. The composite integrated semiconductor device as claimed in claim 6, wherein the input surge/noise absorbing circuit is able to withstand an electrostatic discharge capability of approximately ±1000V at approximately 100 pF and 1500Ω.

9. The composite integrated semiconductor device as claimed in claim 6, wherein the input surge/noise absorbing circuit is able to withstand an electromagnetic compatibility capability of approximately 20 to 100V/m at approximately 10 kHz to 200 MHz.

10. The composite integrated semiconductor device as claimed in claim 6, wherein the outputting devices are positioned at an angle of about 90° or more with respect to a position of the inputting devices.

11. A composite integrated semiconductor being connected to a plurality of inputting terminals of a semiconductor device at front of the input terminals, comprising:
    a plurality of inputting devices receiving an input electrical signal;
    a plurality of outputting devices transmitting an output electrical signal to the plurality of inputting terminals of a semiconductor device;
    a plurality of input surge/noise absorbing circuits to absorb surge or noise of the input electrical signal, each of the input surge/noise absorbing circuits being connected between respective ones of the inputting devices and corresponding outputting devices, each of the input surge/noise absorbing circuits including a first diode being connected between a power source line and the inputting device and a second diode being connected between the power source line and a ground respectively;
    a plurality of attenuating/level-shifting circuits to attenuate or level-shift the input electrical signal, each of the attenuating circuits being connected between respective ones of the inputting devices and corresponding outputting devices; and
    a plurality of electrical signal converting circuits to convert the input electrical signal to the output electrical signal, each of the electrical signal converting circuits being connected between respective ones of the inputting devices and corresponding outputting devices,
    wherein each inputting device, input surge/noise absorbing circuit, attenuating/level shifting-means circuit, electrical signal converting circuit, and outputting device comprise an integrated circuit, and
    wherein the integrated circuits are arranged in a line at each of the inputting terminals and the integrated circuits are formed in a semiconductor substrate.

12. The composite integrated semiconductor device as claimed in claim 11, wherein the input surge/noise absorbing circuit is able to withstand an electrostatic discharge capability of approximately ±0.5 kV to 15 kV at approximately 150 pF and 500Ω.

13. The composite integrated semiconductor device as claimed in claim 11, wherein the input surge/noise absorbing circuit is able to withstand an electrostatic discharge capability of approximately ±1000V at approximately 150 pF and 1500Ω.

14. The composite integrated semiconductor device as claimed in claim 11, wherein the input surge/noise absorbing circuit is able to withstand an electromagnetic compatibility capability of approximately 20 to 100V/m at approximately 10 kHz to 200 MHz.

15. The composite integrated semiconductor device as claimed in claim 11, wherein the outputting devices are positioned at an angle of about 90° or more with respect to a position of the inputting devices.

16. A composite integrated semiconductor device in claim 11, wherein the input surge/noise absorbing circuit comprises:
   a first diode, an anode of the first diode being connected to the inputting terminal and a cathode of the first diode being connected to a power terminal, and
   a second diode, an anode of the second diode being connected to a ground and a cathode of the second diode being connected to the power terminal.

17. The composite integrated semiconductor device as claimed in claim 16, wherein the input surge/noise absorbing circuit is able to withstand an electrostatic discharge capability of approximately ±0.5 kV to 15 kV at approximately 150 pF and 500Ω.

18. The composite integrated semiconductor device as claimed in claim 16, wherein the input surge/noise absorbing circuit is able to withstand an electrostatic discharge capability of approximately ±1000V at approximately 100 pF and 1500Ω.

19. The composite integrated semiconductor device as claimed in claim 16, wherein the input surge/noise absorbing circuit is able to withstand an electromagnetic compatibility capability of approximately 20 to 100V/m at approximately 10 kHz to 200 MHz.

20. The composite integrated semiconductor device as claimed in claim 16, wherein the outputting devices are positioned at an angle of about 90° or more with respect to a position of the inputting devices.

* * * * *